(12) United States Patent
Shen et al.

(10) Patent No.: US 10,815,759 B2
(45) Date of Patent: Oct. 27, 2020

(54) PERFORMING STEAM INJECTION OPERATIONS IN HEAVY OIL FORMATIONS

(71) Applicant: HALLIBURTON ENERGY SERVICES, INC., Houston, TX (US)

(72) Inventors: Xinpu Shen, Houston, TX (US); Guoyang Shen, Houston, TX (US); Douglas Huber, Ruwi (OM)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 16/325,444

(22) PCT Filed: Sep. 28, 2016

(86) PCT No.: PCT/US2016/054195
§ 371 (c)(1),
(2) Date: Feb. 14, 2019

(87) PCT Pub. No.: WO2018/063193
PCT Pub. Date: Apr. 5, 2018

(65) Prior Publication Data
US 2019/0211653 A1 Jul. 11, 2019

(51) Int. Cl.
*E21B 41/00* (2006.01)
*E21B 43/24* (2006.01)
*E21B 47/06* (2012.01)
*E21B 47/07* (2012.01)
*G06F 30/20* (2020.01)

(52) U.S. Cl.
CPC ......... *E21B 41/0092* (2013.01); *E21B 43/24* (2013.01); *E21B 47/06* (2013.01); *E21B 47/07* (2020.05); *G06F 30/20* (2020.01)

(58) Field of Classification Search
CPC ...... E21B 43/24; E21B 41/0092; E21B 47/06; E21B 47/065; E21B 47/07; G06F 17/5009; G06F 30/20
See application file for complete search history.

(56) References Cited

U.S. PATENT DOCUMENTS

| | | | |
|---|---|---|---|
| 6,257,334 B1* | 7/2001 | Cyr | E21B 43/2406 166/263 |
| 10,316,653 B2* | 6/2019 | Coffman | E21B 49/003 |
| 10,508,534 B2* | 12/2019 | Guner | E21B 47/022 |
| 10,614,378 B2* | 4/2020 | Conn | G06N 20/00 |
| 2010/0051280 A1 | 3/2010 | Akram | |
| 2012/0059640 A1* | 3/2012 | Roy | G06F 30/20 703/10 |
| 2012/0150519 A1 | 6/2012 | Bang et al. | |
| 2012/0203524 A1 | 8/2012 | Chin et al. | |
| 2015/0094999 A1 | 4/2015 | Vanderheyden et al. | |

(Continued)

OTHER PUBLICATIONS

International Search Report and Written Opinion; PCT Application No. PCT/US2016/054195; dated Sep. 28, 2016.

(Continued)

Primary Examiner — Daniel P Stephenson
(74) Attorney, Agent, or Firm — Polsinelli PC

(57) ABSTRACT

Systems and methods for performing steam injection operations in heavy oil formations using a fully-coupled thermo-hydro-mechanical model for improved steam penetration during the steam injection operations.

20 Claims, 11 Drawing Sheets

(56) References Cited

U.S. PATENT DOCUMENTS

| | | |
|---|---|---|
| 2015/0354336 A1 | 12/2015 | Maurice et al. |
| 2016/0098502 A1* | 4/2016 | Havre .................... E21B 43/00 |
| | | 703/9 |
| 2016/0281497 A1* | 9/2016 | Tilke ....................... E21B 49/00 |
| 2017/0177992 A1* | 6/2017 | Klie ......................... G06F 30/20 |
| 2019/0211653 A1* | 7/2019 | Shen ....................... E21B 47/06 |

OTHER PUBLICATIONS

Search Report; French Application No. 1757927; dated Feb. 19, 2020.
Freeman, Tony Tooraj et al., "Geomechanics of Heterogeneous Bitumen Carbonates", Society of Petroleum Engineers, SPE-119151; SPE Reservoir Simulation Symposium, Feb. 2-4, The Woodlands, Texas, 2009.
Vaziri, Hans. H. et al, "Theory and Application of a Fully Coupled Thermo-Hydromechanical Finite-Element Model", Society of Petroleum Engineers, SPE-25306; 1992, abstract only.

* cited by examiner

PERFORMING STEAM INJECTION OPERATIONS IN HEAVY OIL FORMATIONS

CROSS-REFERENCE TO RELATED APPLICATIONS

This application is a national stage entry of PCT/US2016/054195 filed Sep. 28, 2016, said application is expressly incorporated herein in its entirety.

FIELD OF THE DISCLOSURE

The present disclosure generally relates to systems and methods for performing steam injection operations in heavy oil formations. More particularly, the present disclosure relates to performing steam injection operations in heavy oil formations using a fully-coupled thermo-hydro-mechanical model for improved steam penetration during the steam injection operations.

BACKGROUND

Steam penetration in heavy oil formations can be a difficult and complicated process. In this process, overheated steam is injected into the heavy oil formation. As the injected steam contacts the formation, heat transfers between the steam and the formation along with the porous flow of steam within formation. The injected steam heats up the heavy oil within the porous formation as well as the formation solid matrix also referred to as the formation matrix skeleton. Thermal expansion occurs in both the formation matrix skeleton and the oil fluid existing in the pores of the formation. Consequently, volume expansion of pore fluid causes an increase of pore pressure. And, inward expansion of the formation matrix skeleton around the micro-scale pores contributes to the increase in pore pressure. Furthermore, discrepancy of thermal expansion of the oil and formation matrix skeleton intensifies the increasing pore pressure from its original value. As the pore pressure increases, cracks are created and the permeability of the formation increases.

The injected steam also decreases the dynamic viscosity of the oil fluid as the temperature increases. Relative permeability of the formation thus, increases as the temperature increases. Steam being injected into the heavy oil formation condenses into liquid water as it transfers heat to the formation. Therefore, there are three kinds of fluid in the formation during steam penetration: i) steam being injected in the formation, which is in the phase of gas; ii) liquid water, which is the condensate of injected steam; and, iii) liquid oil, which is being heated up so that its dynamic viscosity is small enough to flow within the formation. Heat transfer during steam penetration can also be classified as either conductive or convective. Conductive heat transfer occurs during the steam-formation contact at the wellbore surface before steam penetrates into the formation and also during the thermal contact between the two continuums within micro-cracks and pores within the formation after steam penetration. Heat being released from the steam is transferred into the formation by thermal conduction. Convective heat transfer occurs as hot fluid flows within the formation and transports fluid mass from one place to another under the driving force of pore pressure gradient. Heat from fluid with higher temperatures is transferred to the formation where there is lower pore pressure in the process of porous flow.

During the steam penetration process, the steam, water (which is condensate of steam), and heated oil will flow together in some way. With the continuous injection of overheated steam, the front region of melted heavy oil (also known as the steam chamber) propagates in the form of finger-like geometry instead of a smooth front edge. This is often referred to as steam fingering and may also be referred to as finger penetration. There are various explanations of the steam fingering phenomena, but only in the context of thermal transfer and/or material heterogeneity. Conventional sequential coupling techniques, for example, are used to model steam penetration in heavy oil formations, which assume a rigid porous formation that does not account for deformation. This type of model therefore, uses only a thermal analysis and a porous flow analysis to simulate steam injection results in the form of a thermo-hydro coupled model. As a result, the steam fingering phenomena is not simulated within an acceptable degree of accuracy.

BRIEF DESCRIPTION OF THE DRAWINGS

The present disclosure is described below with references to the accompanying drawings in which like elements are referenced with like reference numerals, and in which.

DETAILED DESCRIPTION OF THE PREFERRED EMBODIMENTS

The present disclosure overcomes one or more deficiencies in the prior art by providing systems and methods for performing steam injection operations in heavy oil formations using a fully-coupled thermo-hydro-mechanical model for improved steam penetration during the steam injection operations.

The subject matter of the present disclosure is described with specificity, however, the description itself is not intended to limit the scope of the disclosure. The subject matter thus, might also be embodied in other ways, to include different structures, steps and/or combinations similar to and/or fewer than those described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be described with respect to the oil and gas industry, it is not limited thereto and may also be applied in other industries (e.g. drilling water wells) to achieve similar results.

Method Description

Figure 1:
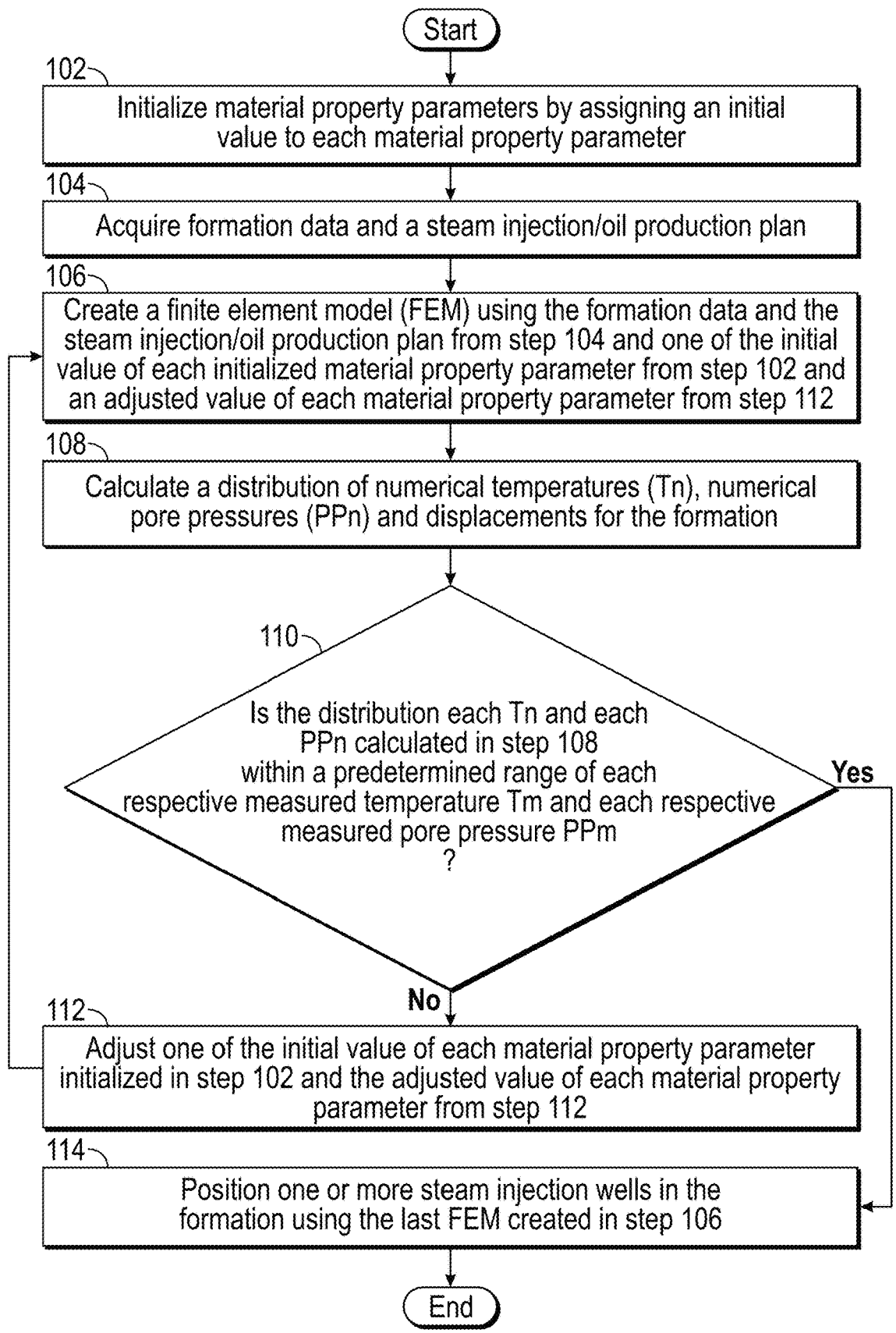
FIG. 1 is a flow diagram illustrating one embodiment of a method for implementing the present disclosure.

Referring now to FIG. 1, a flow diagram illustrates one embodiment of a method 100 for implementing the present disclosure. The method 100 determines values for certain material parameters of the fully-coupled thermo-hydro-mechanical model used for improving steam penetration during steam injection operations in heavy oil formations. For those parameters described herein below that depend on temperature only (i.e. specific heat of pore fluid, thermal expansion of pore fluid, thermal expansion coefficient of formation matrix skeleton and specific heat of formation matrix skeleton), their values may be determined by conventional laboratory testing. For those remaining parameters described herein below that depend on strain in the formation, their values are determined by the method 100.

The model: i) consists of two phases of materials: fluid (mixture of steam, water, and oil), and formation matrix skeleton; ii) addresses three kinds of physics: thermal field (temperature), hydro-field (pore pressure), and mechanical field (deformation); and iii) includes a temperature value at a spatial point for all the materials and pore pressure value for the mixture fluid at the spatial point. For simplification of the model, a multiphase mixture of fluid is used as a synthetic of the two phases of fluid (i.e. gas and liquid) and two kinds of fluid materials (i.e., water and oil). This multiphase mixture is regarded as one kind of fluid flowing in the porous formation. Therefore, all model parameters such as permeability and pore fluid expansion are defined to describe the mechanical behavior of the mixture in the model. The values of the model parameters are determined by using a phenomena-match technique with observed values of mechanical variables such as deformation distribution, pore pressure contour and/or temperature contour. Both conductive heat transfer and convective heat transfer are modeled.

With this simplified fully coupled thermal-hydro-mechanical model, primary variables including displacement u, pore pressure p, and temperature T at a spatial point in a three-dimensional (3D) space can be solved simultaneously with a set of partial differential equations. The coupled relationships for material behavior properties include: i) coupling between the orthotropic conductivity and strain also referred to as strain-dependent orthotropic conductivity; and ii) coupling between permeability and temperature.

Coupling Between the Orthotropic Conductivity and Strain

Originally the value of conductivity is assumed the same in all the three directions, but the value of conductivity will vary with the tensile normal strain component in its direction. The tensile strain in the horizontal direction will cause an increase of conductivity in the vertical direction, and vice versa. Compressive strain will not impact conductivity. It can be expressed in general as $h_i = h_i(\varepsilon_1, \varepsilon_2, \varepsilon_3)$. In this equation, subscript i=1 to 3 and indicates the value of thermal conductivity in the three orthotropic principal directions. $\varepsilon_1, \varepsilon_2, \varepsilon_3$ are values of strain components in these three principal directions. This coupling may be expressed in a tabular form as shown in Table 1 below.

Coupling Between Permeability and Temperature

Hydraulic conductivity can be used to calculate the porous flow within a heavy oil formation. This porous flow may be used to model the flow of the synthetic fluid's flow within the formation. The hydraulic conductivity may be expressed as:

$$\hat{k}_i = \frac{K_i g \rho}{\mu}.$$

In this equation, $\hat{k}_i$ is hydraulic conductivity and includes three principal values in three orthotropic directions of the formation; $K_i$ is the intrinsic permeability; $\mu$ is the dynamic viscosity; g and $\rho$ are gravity acceleration and the density of the formation, respectively. Because of this type of coupling, temperature dependency and strain dependency may be expressed as: $\mu = \mu(T)$ and $K_i = K_i(\varepsilon_1, \varepsilon_2, \varepsilon_3)$, respectively. Consequently, there is the following expression for $\hat{k}_i$ as $\hat{k}_i = \hat{k}_i(T, \varepsilon_1, \varepsilon_2, \varepsilon_3)$. This coupling may also be expressed in a tabular form as shown in Table 2 below.

Other factors that may impact the coupling relationships addressed in the model include:

i) Coupling between the degradation of orthotropic Young's modulus $E_i$ and strain also referred to as orthotropic elastic-damage, which may be expressed as:

$$E_i = E_i(\varepsilon_1, \varepsilon_2, \varepsilon_3), \ i=1 \text{ to } 3$$

ii) Coupling between temperature and $\alpha_s$ expansion coefficient of the formation matrix skeleton, which may be expressed as:

$$\alpha_s = \alpha_s(T)$$

iii) Coupling between temperature and $\alpha_p$ expansion coefficient of pore fluid, which may be expressed as:

$$\alpha_p = \alpha_p(T)$$

iv) Coupling between temperature and $\beta_s$ specific heat of the formation matrix skeleton, which may be expressed as:

$$\beta_s = \beta_s(T)$$

v) Coupling between temperature and $\beta_p$ specific heat of fluid, which may be expressed as:

$$\beta_p = \beta_p(T)$$

Figure 20:
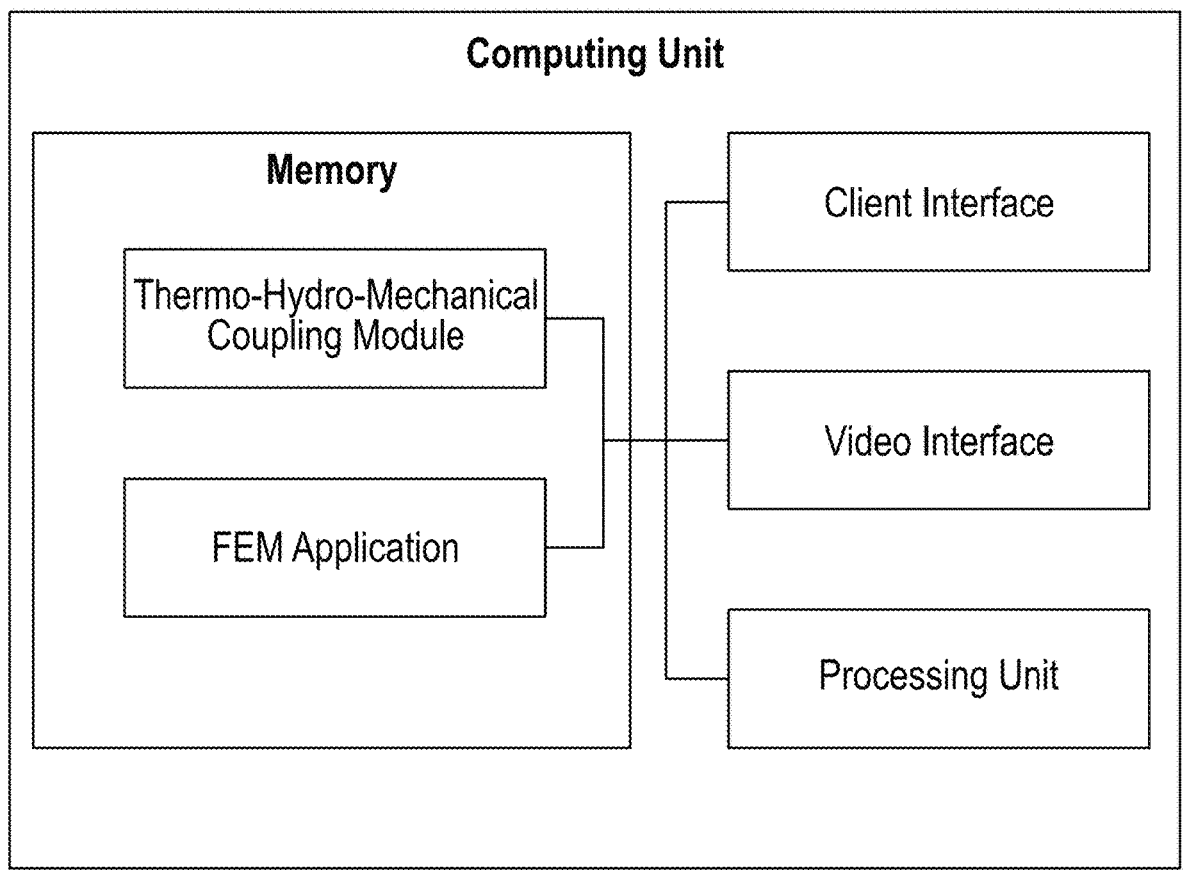
FIG. 20 is a block diagram illustrating one embodiment of a computer system for implementing the present disclosure.

In step 102, material property parameters are initialized by assigning an initial value to each material property parameter using the client interface and/or the video interface described further in reference to FIG. 20. The material property parameters include thermal conductivity in each (x,y,z) direction, Young's Modulus (YM), temperature dependent permeability and hydraulic conductivity.

In step 104, formation data derived from logging tools and a steam injection/oil production plan are acquired. The formation data include, for example, data extents within a well-known coordinate system (e.g. Cartesian), and conventional environmental parameters (e.g. density of the formation matrix skeleton, geostress of the formation matrix skeleton and pore pressure of the formation fluid). The conventional environmental parameters each include an initial value that is constant. The steam injection/oil production plan includes, but is not limited to, a period of time for steam injection; steam temperature and its variation with time; steam pressure and its variation with time or steam injection rate and its variation with time; and oil/liquid (may be a mixture of oil and liquid water) production rate and its variation with time. This step may be performed in parallel with step 102.

In step 106, a finite element model (FEM) is automatically created using the formation data and steam injection/oil production plan from step 104, one of the initial value of each initialized material property parameter from step 102 and an adjusted value of each material property parameter from step 112, and techniques well known in the art. The FEM, which can include millions of partial differential equations, represents the mechanical behavior and porous flow of the modeled synthetic fluid in the formation. The FEM includes temperatures at respective nodes with elemental behavior descriptions defined by respective partial differential equations.

In step 108, a distribution of numerical temperatures (Tn), numerical pore pressures (PPn) and displacements is automatically calculated for the formation using well-known techniques to solve for each Tn, PPn and displacement at each node of the FEM created in step 106.

In step 110, the method 100 automatically determines if the distribution of each Tn and each PPn calculated in step 108 is within a predetermined range of each respective measured temperature Tm and each respective measured pore pressure PPm from a monitoring well positioned in the formation. The comparable distribution of Tm and PPm is obtained from thermal sensors and pore pressure sensors distributed throughout the monitoring well. If each Tn and each PPn does not is within a predetermined range of each respective measured temperature Tm and each respective measured pore pressure PPm, then the method 100 proceeds to step 112. Otherwise, the method 100 proceeds to step 114. When each Tn and each PPn is within a predetermined range of each respective measured temperature Tm and each respective measured pore pressure PPm, then the last FEM created in step 106 represents a fully-coupled thermo-hydro-mechanical model that may be used for improving steam penetration during steam injection operations in heavy oil formations. The distribution of numerical temperatures (Tn), numerical pore pressures (PPn) and displacements calculated in step 108, after the last FEM is created, may be used to determine those material property parameters that are a function of Tn and PPn in step 102. In this manner, fewer computational resources are required to achieve a more accurate simulation of the steam fingering phenomena and improve steam penetration in heavy oil formations compared to conventional sequential coupling techniques.

In step 112, one of the initial value of each material property parameter initialized in step 102 and the adjusted value of each material property parameter from a prior iteration of this step is adjusted using the client interface and/or the video interface described further in reference to FIG. 20. The method 100 then returns to step 106 and repeats steps 106-112 using the last adjusted material property parameter values until each Tn and each PPn is within a predetermined range of each respective measured temperature Tm and each respective measured pore pressure PPm. If Tn is larger than Tm, which indicates that the amount of heat being transferred in the FEM is too much compared to that being measured at the monitoring well, then the value of each material property parameter initialized in step 102 is reduced by a predetermined amount. If Tn is smaller than Tm, then the value of each material property parameter initialized in step 102 is increased by a predetermined amount. Similar adjustments are made to the value of each material property parameter initialized in step 102 based on PPn and PPm.

In step 114, the last FEM created in step 106, which represents a fully-coupled thermo-hydro-mechanical model, is used to position one or more steam injection wells in the formation for improving steam penetration during steam injection operations in heavy oil formations. Contrary to conventional sequential coupling techniques, the fully-coupled thermo-hydro-mechanical model considers i) strain-dependent conductivity; ii) thermal conductivity heat transfer based on strain-dependent conductivity and temperature dependent permeability; and iii) porous flow—also referred to herein as convective heat transfer through fluid flow.

EXAMPLES

The application of the method 100 to the analysis of steam penetration in two different processes is presented by the following examples for the purpose of validation and principle illustration. The method 100 can also be applied to the analysis of Cyclic Steam Stimulation (CSS).

Steam-Assisted Gravity Drainage (SAGD)

In this example, a transient thermal-hydro-mechanical analysis is performed for SAGD steam penetration within the heavy oil formation according to the method 100. A numerical solution of temperature distribution and pore pressure distribution caused by steam penetration are presented along with a contour of some other mechanical variables. It should be noted that the data used in this example is not real formation data but rather, is simulated data for purposes of illustration.

The Model Geometry and Mesh

Figure 2:
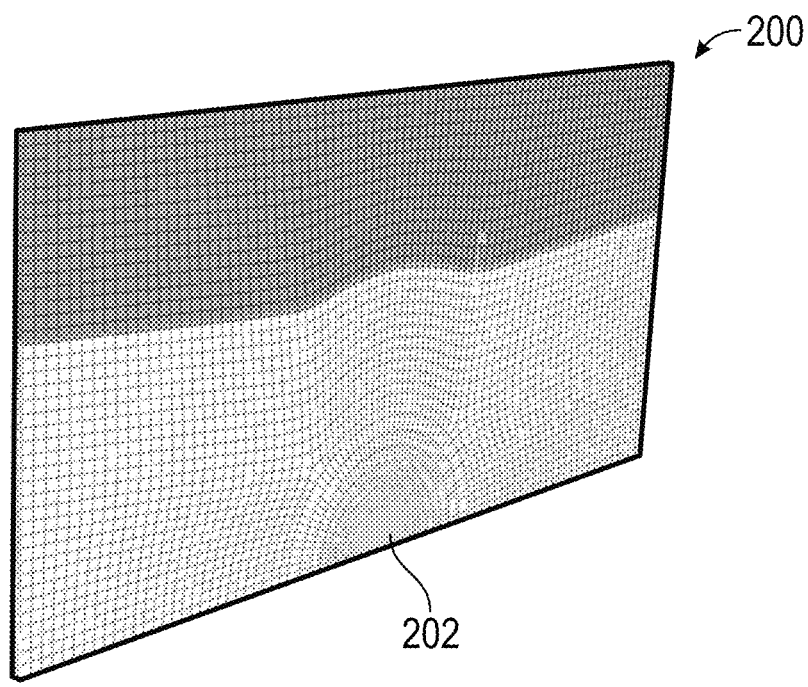
FIG. 2 is a graphical display illustrating a model of the geometry and its finite element mesh surrounding a wellbore.
Figure 3:
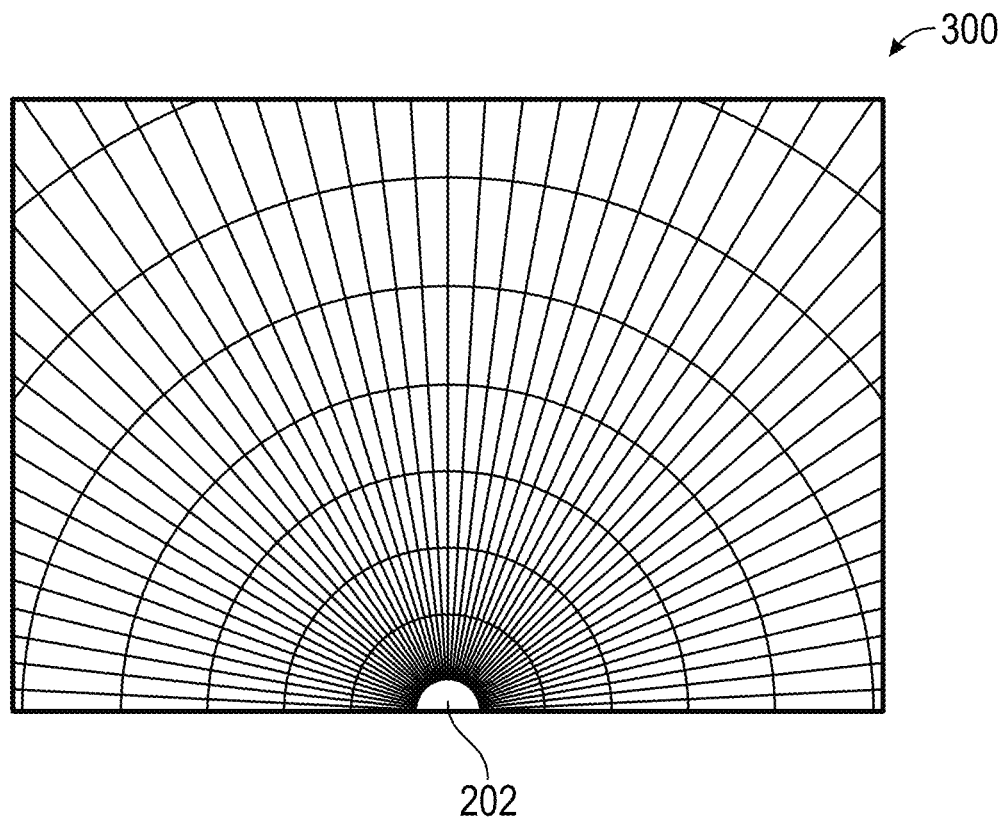
FIG. 3 is a graphical display illustrating an enhanced perspective of the finite element mesh surrounding the wellbore in FIG. 2.

In FIG. 2, a graphical display 200 of the model geometry and its finite element mesh are illustrated. The mesh includes a horizontal well-section and a wellbore 202 at the center of the bottom edge. The horizontal well-section and wellbore 202 are better illustrated by the graphical display 300 in FIG. 3. Focus of the analysis is given to the distribution and variation of mechanical variables in the region above the horizontal well-section in the process of steam penetration. The model is actually a 3D model, but is simplified to be a slice in 3D space, for the purpose of minimizing the computational cost. In this manner, the steam penetration for cross sectional area along the horizontal well-section are similar. The true vertical depth (TVD) of the horizontal wellbore is at 260 m (853 ft). The model height is 50 m, the model length is 100 m, and the model thickness is 5 m. The diameter of the wellbore 202 is 0.3048 m (10 in). It is an open-hole well-section. The reservoir formation includes a thickness of 25 to 30 m. There is a layer of shale formation above the heavy oil formation. Only partial thickness of overburden formations are modeled as the upper part of the model. The other parts are simplified as overburden loadings traction on the top of this model.

Initial Conditions, Boundary Conditions and Loadings

Initial pore pressure for the model is 1.5 MPa (about 217 psi) For simplicity, initial geostress for the model is the vertical stress component at the top (2.82 MPa) and at the bottom (3.76 MPa). The lateral stress coefficient is 0.65 for both horizontal directions. The formation's density is 1800 kg/m3. Initial temperature is 50° C. Initial porosity is 0.3. Gravity load is also applied to the model. A zero displacement condition is applied to 4 lateral surfaces as well as to the bottom surface. A constant temperature boundary condition is applied to the lateral surfaces on the left and right respectively.

Figure 4:
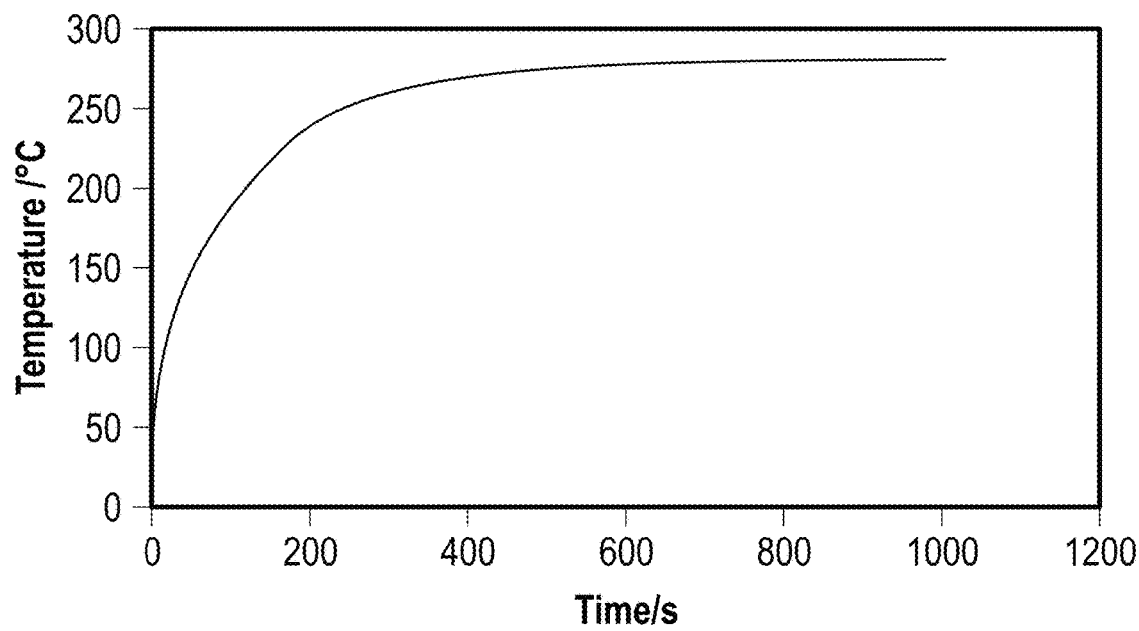
FIG. 4 is a graph of a temperature-time curve, which is based on a transient thermal analysis.

In FIG. 4, a graph of a temperature-time curve, which is based on a transient thermal analysis, is illustrated. Pressure of the injected steam has two effects at the wellbore surface: first it applies a surface pressure to the wellbore surface, and second it applies a boundary condition of pore pressure with the same value of injected pressure. In this manner, pressure of the steam is 3 MPa. Thus, the boundary condition of pore pressure at the wellbore surface is 3 MPa and the uniform traction pressure load to the wellbore surface is also 3 MPa.

Values of Material Parameters [Step 106]

Table-1 below illustrates the model in tabular form. Due to the high value of its dynamic viscosity, hydraulic conductivity in the heavy oil formation at original temperature is low. As its dynamic viscosity μ decreases significantly with increase of temperature, the value of hydraulic conductivity thus, increases with temperature. An increase in pore pressure will open the natural fractures and thus, the value of permeability will increase as well. For these reasons, the initial value of hydraulic conductivity is $1 \times 10^{-14}$ m/s, which can increase to $5 \times 10^{-12}$ m/s as temperature increases to 280° C. The value of thermal conductivity listed in Table-1 below is a synthetic value adjusted by matching phenomena. Its original value is 500, which is increased to 500000 as the strain value reaches 0.001. A temperature-dependence property is introduced into the thermal expansion coefficient of the solid formation skeleton, the pore fluid and the specific heat of pore fluid listed in Table-1. A strain-dependent relationship is introduced into the Young's modulus in the process of steam penetration, which is also listed in Table-1.

TABLE 1 values of the model material parameters.

| Strain-dependent Conductivity | | | | | |
|---|---|---|---|---|---|
| h11 | h22 | h33 | LE_11 | LE33 | SMises |
| 500 | 0 | 500 | 0 | 0 | 0 |
| 500 | 0 | 500 | 1.00E−06 | 0 | 1.00E+06 |
| 500 | 0 | 5500 | 1.00E−06 | 0 | 2.00E+06 |
| 500 | 0 | 5501 | 1.00E−06 | 0 | 4.00E+06 |
| 500 | 0 | 55002 | 1.00E−05 | 0 | 4.00E+06 |
| 500 | 0 | 5500002 | 1.00E−04 | 0 | 4.00E+06 |
| 500 | 0 | 5500005 | 1 | 0 | 4.00E+06 |
| 500 | 0 | 5500005 | 1 | 1.00E−06 | 4.00E+06 |
| 2000 | 0 | 5500005 | 1 | 1.00E−05 | 4.00E+06 |
| 4000 | 0 | 5500005 | 1 | 1.00E−04 | 4.00E+06 |
| 5000 | 0 | 5500005 | 1 | 5.00E−04 | 4.00E+06 |
| 50000 | 0 | 5500005 | 1 | 9.00E−04 | 4.00E+06 |
| 5000000 | 0 | 5500005 | 1 | 2e−3. | 4.00E+06 |

| Elastic | | | Expansion | |
|---|---|---|---|---|
| YM | PR | LE | Exp Coe. | Temp. |
| 5.00E+09 | 0.23 | 1.00E−06 | 3.00E−06 | 50 |
| 1.00E+08 | 0.23 | 3.00E−04 | 2.80E−06 | 250 |

| Temp-dependent Perm/hydraulic conductivity | | |
|---|---|---|
| k | void ratio | temp. |
| 1.00E−14 | 0.44 | 50 |
| 1.10E−14 | 0.44 | 82 |
| 5.00E−13 | 0.44 | 82.5 |
| 5.00E−12 | 0.44 | 83 |
| 5.00E−12 | 0.44 | 280 |

| Expansion-Pore Fluid | | |
|---|---|---|
| Exp Coe. | Temp. | Dens. |
| 2.00E−06 | 50 | (PF) |
| 2.00E−06 | 8.10E+01 | 100 |
| 6.00E−06 | 8.25E+01 | Cond. |
| 8.00E−06 | 2.50E+02 | (PF) |
| 1.00E−05 | 2.80E+02 | 1.50E+04 |

| Specific Heat (Pore F) | | Spe.Heat |
|---|---|---|
| 2.00E+03 | 5.00E+01 | 2.00E+04 |
| 1.90E+03 | 8.10E+01 | Density |
| 1.80E+03 | 8.25E+01 | 1000 |
| 8.00E+02 | 2.80E+02 | |

Figure 5:
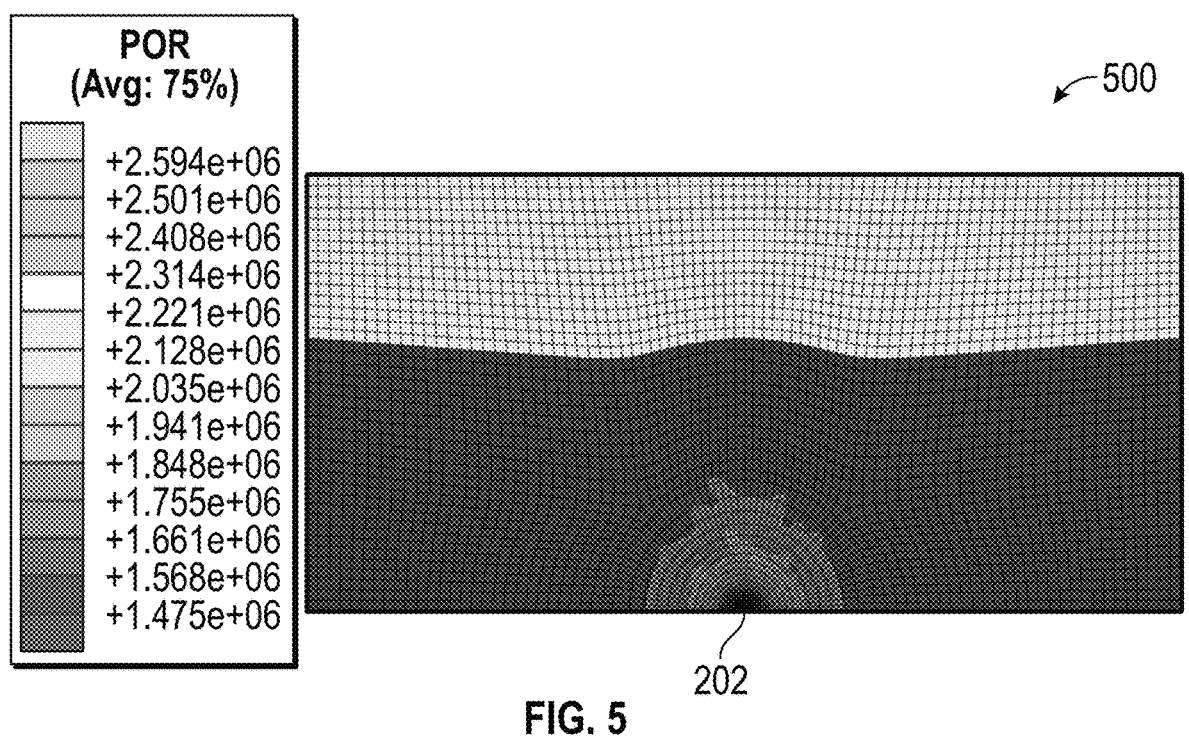
FIG. 5 is a graphical display illustrating the contour of pore pressure (POR) within the model in FIG. 2 during steam penetration at time t=105,000 s.
Figure 6:
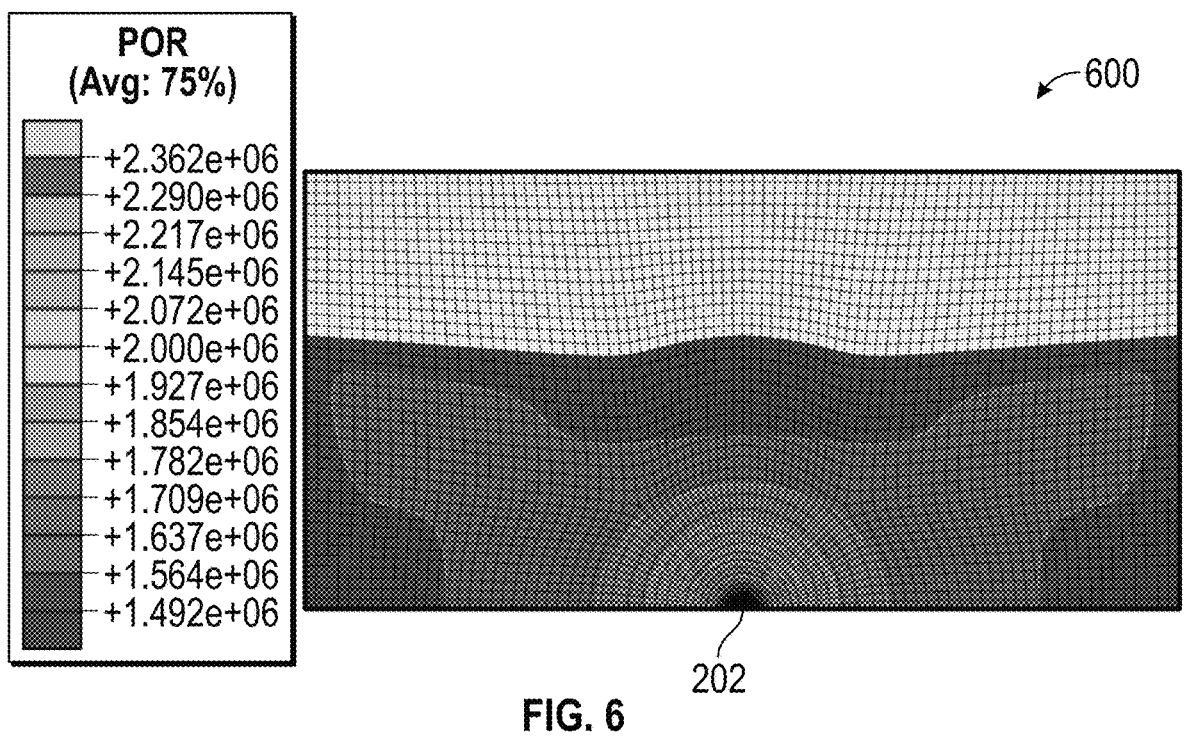
FIG. 6 is graphical display illustrating the contour of pore pressure within the model in FIG. 2 at time t=1,008,110 s.
Figure 7:
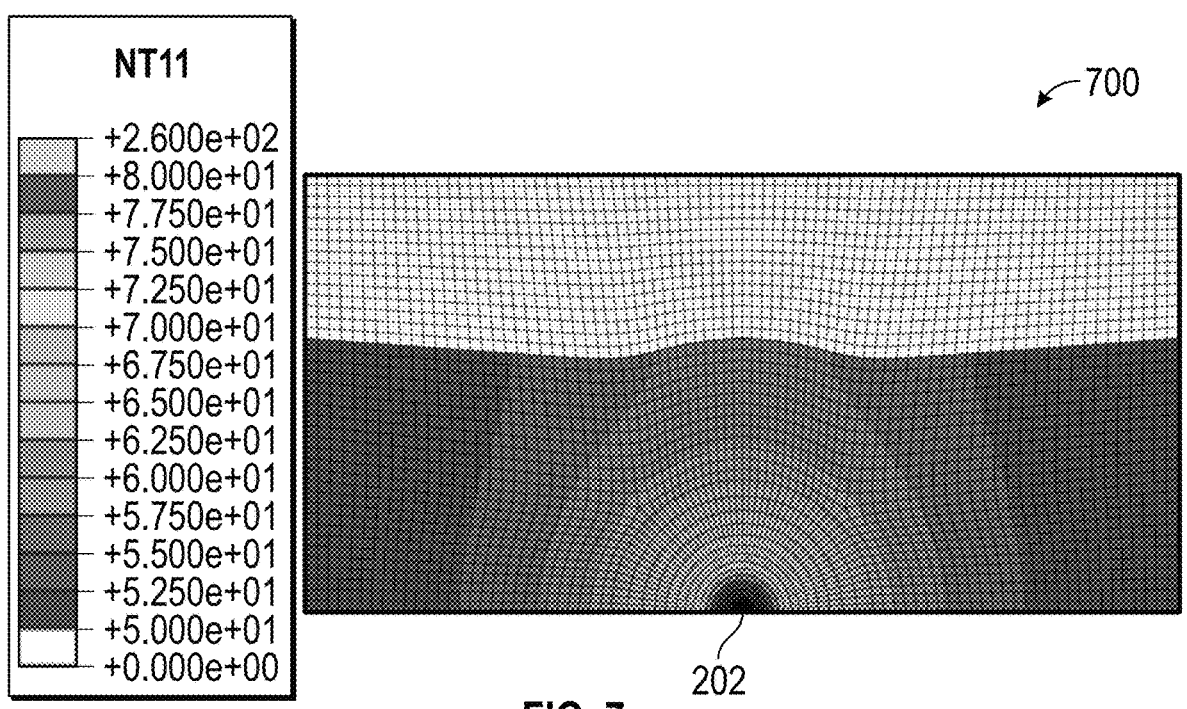
FIG. 7 is a graphical display illustrating the contour of temperature (nodal temperature NT11) within the model in FIG. 2 at time t=1,008,110 s.
Figure 8:
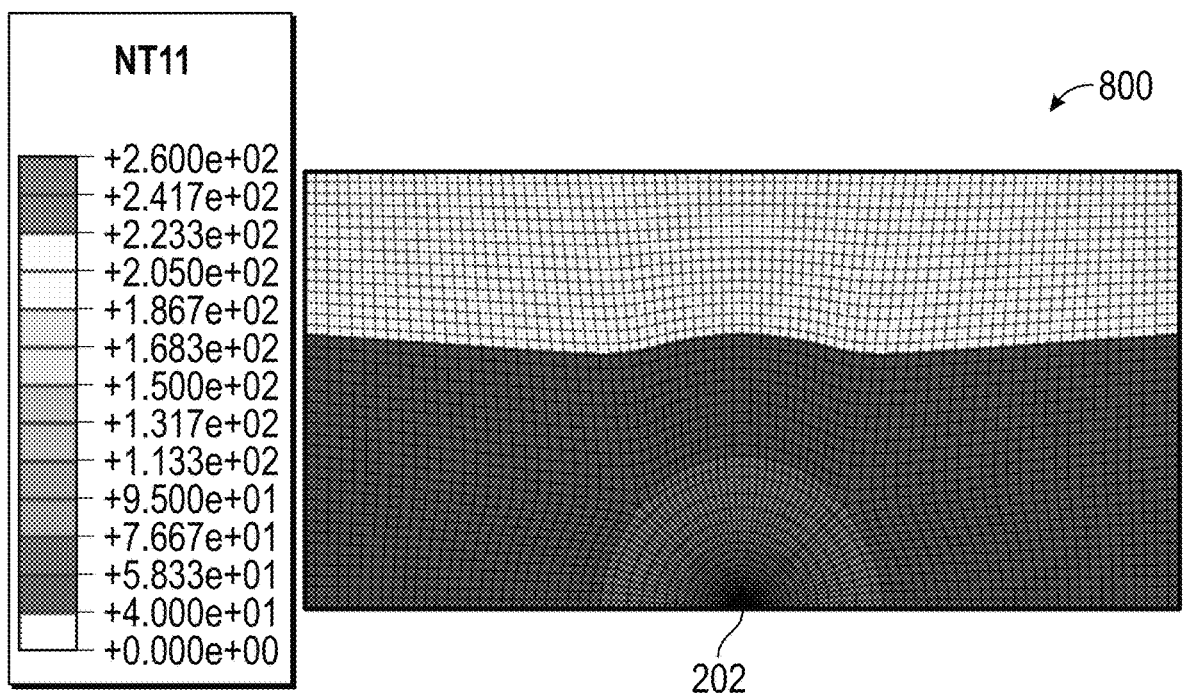
FIG. 8 is a graphical display illustrating the contour of temperature within the model in FIG. 2 at time t=1,008,110 s with a value range from 50° C. to 280° C.
Figure 9:
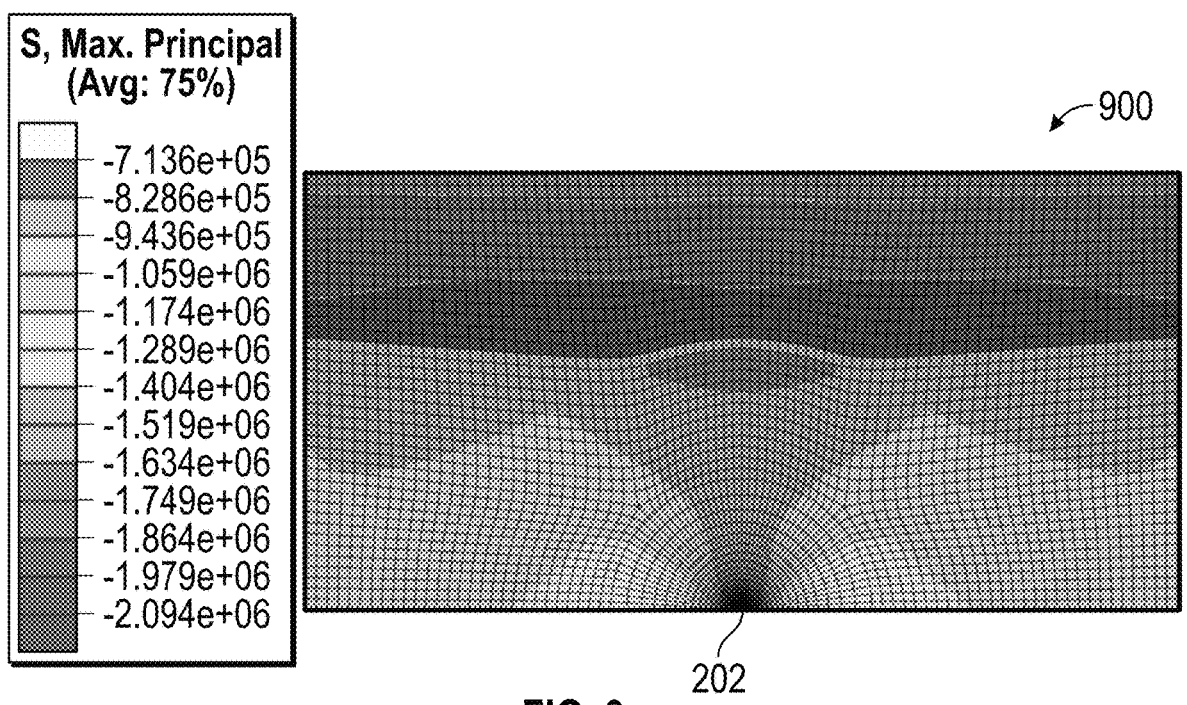
FIG. 9 is a graphical display illustrating the contour of maximum principal stress (i.e. the minimum compressive stress) (SMAX) in the horizontal direction (LE11) within the model in FIG. 2 at time t=1,008,110 s.
Figure 10:
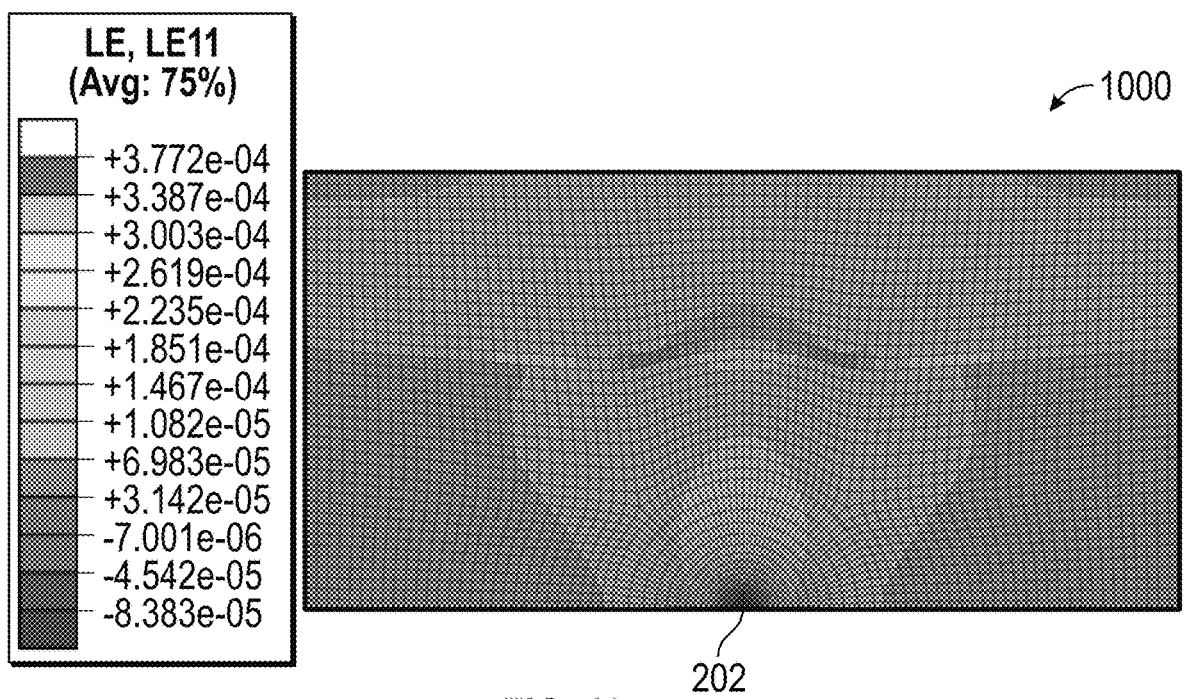
FIG. 10 is a graphical display illustrating the contour of normal strain in the horizontal direction (LE11) within the model in FIG. 2 at time t=1,008,110 s.

The symbols used in Table-1 are given as:
h11=Thermal conductivity in the x direction, W/(mK)
h22=Thermal conductivity in the y direction, W/(mK)
h33=Thermal conductivity in the z direction, W/(mK)
LE11=Strain in the x direction
LE33=Strain in the z direction
k=Hydraulic conductivity, m/s
YM=Young's Modulus, Pa
PR=Poisson's Ratio
LE=Maximum strain component Numerical Results of Steam Penetration of SAGD Referring now to FIGS. 5-10, these graphical displays illustrate various contours of pore pressure, temperature, maximum principal stress and normal strain in x-direction LE11 during steam penetration (e.g. normal strain components and shear strain components, which can be tensile or compressive). In FIG. 5, the graphical display 500 illustrates the contour of pore pressure (POR) within the model during steam penetration at time t=105,000 s, which is about 1.2 days. The front edge of the pore pressure, which is significantly higher than its original value, has the geometry of finger. This is regarded as the phenomenon of steam fingering. In FIG. 6, the graphical display 600 illustrates the contour of pore pressure within the model at time t=1,008,110 s, which is about 12 days. The geometry of this pore pressure contour is wide in the upper part, and narrower in the lower part. In FIG. 7, the graphical display 700 illustrates the contour of temperature (nodal temperature NT11) within the model at time t=1,008,110 s. Only the value of temperature ranging from 50° C. to 80° C. is illustrated in order to show the distribution of temperature in the lower range of values. In FIG. 8, the graphical display 800 illustrates the contour of temperature within the model at time t=1,008,110 s, with value range from 50° C. to 280° C. In FIGS. 9-10, the graphical displays 900, 1000 illustrate the contours of maximum principal stress (i.e. the minimum compressive stress) (SMAX) and normal strain in the horizontal direction (LE11) within the model at time t=1,008,110 s, respectively. With reference to the model's coupling properties described above, FIG. 10 actually shows the distribution of conductivity and permeability in the vertical direction.

Steam Flooding

In this example, a transient thermal-hydro-mechanical analysis is performed for steam-flooding steam penetration within the heavy oil formation according to the method 100. A numerical solution of temperature distribution and pore pressure distribution caused by steam penetration are presented along with a contour of some other mechanical variables. It should be noted that the data used in this example is not real formation data but rather, is simulated data for purposes of illustration.

The Model Geometry and Mesh

Figure 11:
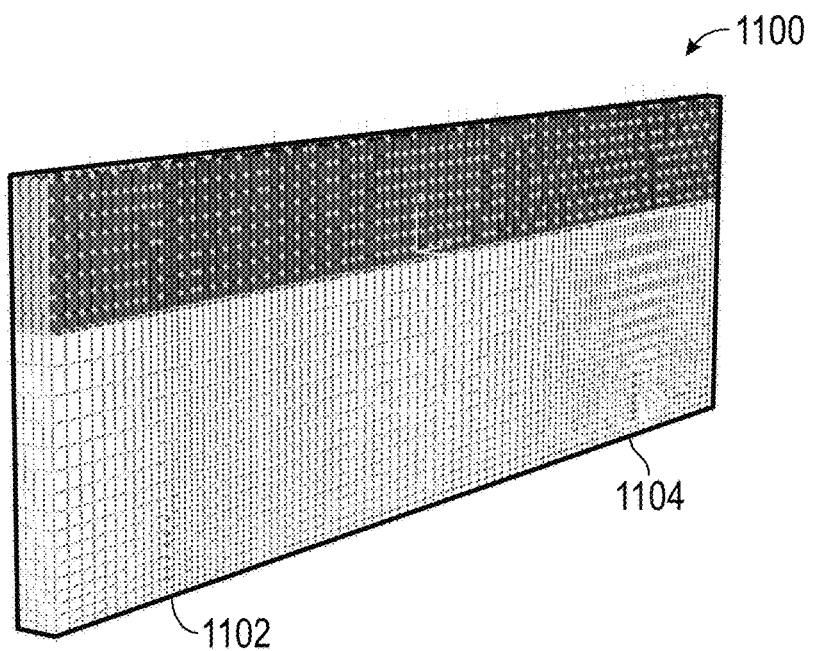
FIG. 11 is a graphical display illustrating a model of the geometry and its finite element mesh surrounding an injection well and a production well.

In FIG. 11, a graphical display 1100 of the model geometry and its finite element mesh are illustrated. A vertical well-trajectory is used for both the injection well 1102 and the production well 1104. Cased hole completion is used. Perforated well sections where steam has contact with the formation are set at the lower part of the wellbore and are represented by the dots. Focus of the analysis is given to the distribution and variation of mechanical variables in the region between the injection well 1102 and the production well 1104 in the process of steam penetration. The model is actually a 3D model, but is simplified to be a slice in 3D space, for the purpose of minimizing the computational cost. True vertical depth (TVD) of the horizontal wellbore is at 260 m (853 ft). The model height is 45 m, the model length is 140 m, and the model thickness is 5 m. The length of the perforation well-section is 7 m. The reservoir formation includes a thickness of 30 m. There is a layer of shale formation above the heavy oil formation. Only partial thickness of overburden formations is modeled as the upper part of the model. The other parts are simplified as overburden loadings traction on the top of this model.

Initial Conditions, Boundary Condition and Loading

Initial pore pressure for the model is 1.5 MPa (about 217 psi). For simplicity, initial geostress for the model is the vertical stress component at the top (2.82 MPa) and at the bottom (3.76 MPa). The lateral stress coefficient is 0.65 for both horizontal directions. The formation's density is 1800 kg/m3. Initial temperature is 50° C. Initial porosity is 0.3. Initial temperature of the steam is 250° C. Gravity load is also applied to the model. A zero displacement condition is applied to 4 lateral surfaces as well as to the bottom surface. The time-dependent temperature boundary condition illustrated in FIG. 4 with maximum temperature as 250° C. is used here. In this example, the pressure of steam at the injection point is not a constant. Pressure of oil at the production well is 1.5 MPa, which is the initial value of the pore pressure field.

Values of Material Parameters

Most values for the material parameters of this model are the same as those in Table-1. Some values, however, are not and are listed in Tables 2 and 3. Due to the lower value of its dynamic viscosity, permeability in the heavy oil formation in steam flooding is higher than for SAGD. This is demonstrated by the values of permeability and temperature-dependency listed in Table-2. For these reasons, the initial value of permeability is 0.1 Darcy, which can increase to 5 Darcy as temperature increases to 250° C. Strain-dependent orthotropic elastic properties are used in the mode. Namely, the value of Young's modulus decreases with increases of normal strain in that direction. This is demonstrated by the values of Young's modulus and its strain-dependency listed in Table-3. For simplicity, the initial values of Young's modulus are the same for each direction, but the orthotropic properties are induced ones. Although the value of E for each direction listed in Table 3 is the same for the same amount of strain, in the process of steam penetration, strain values occurring at each spatial point are not the same. Consequently, there will be induced-orthotropy of Young's modulus. The values for conductivity are taken from Table-1. Its original value is 500, which is increased to 500000 as the temperature increases to 250° C.

TABLE 2

Values of hydraulic conductivity and its temperature-dependency.
Perm/hydraulic conductivity

| k11 | k22 | k33 | void ratio | Temperature |
|---|---|---|---|---|
| 1.00E−13 | 1.00E−13 | 1.00E−13 | 0.44 | 50 |
| 1.10E−13 | 1.10E−13 | 1.10E−13 | 0.44 | 82 |
| 5.00E−13 | 5.00E−13 | 5.00E−13 | 0.44 | 82.5 |
| 5.00E−11 | 5.00E−11 | 5.00E−11 | 0.44 | 83 |
| 5.00E−10 | 5.00E−10 | 5.00E−10 | 0.44 | 250 |

TABLE 3

Values of Young's modulus and its strain-dependency.
Orthotropic elastic properties

| E1 | E2 | E3 | v12 | v13 | v23 | G12 | G13 | G23 | LE11 | LE33 |
|---|---|---|---|---|---|---|---|---|---|---|
| 3E+09 | 3E+09 | 5E+09 | 0.25 | 0.25 | 0.25 | 1.2E+09 | 2E+09 | 2E+09 | 0 | 0 |
| 3E+09 | 3E+09 | 3E+09 | 0.25 | 0.25 | 0.25 | 1.2E+09 | 1.2E+09 | 1.2E+09 | 0 | 1.00E−06 |
| 3E+09 | 3E+09 | 1E+08 | 0.25 | 0.25 | 0.25 | 1.2E+09 | 8e7 | 8e7 | 0 | 0.001 |
| 1.8E+09 | 1.8E+09 | 1E+08 | 0.25 | 0.25 | 0.25 | 1.08E+09 | 8e7 | 8e7 | 1.00E−06 | 0.001 |
| 1E+08 | 1E+08 | 1E+08 | 0.25 | 0.25 | 0.25 | 4e7 | 4e7 | 4e7 | 0.001 | 0.001 |

Figure 12:
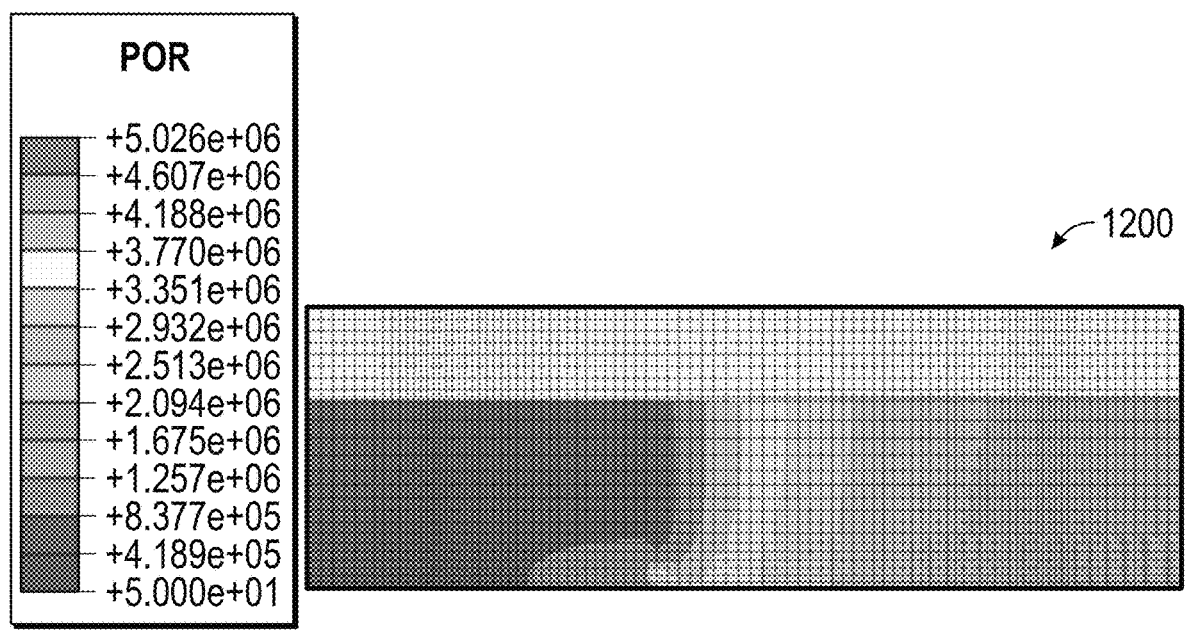
FIG. 12 is a graphical display illustrating pore pressure distribution within the model during steam penetration at time t=108,000 s.
Figure 13:
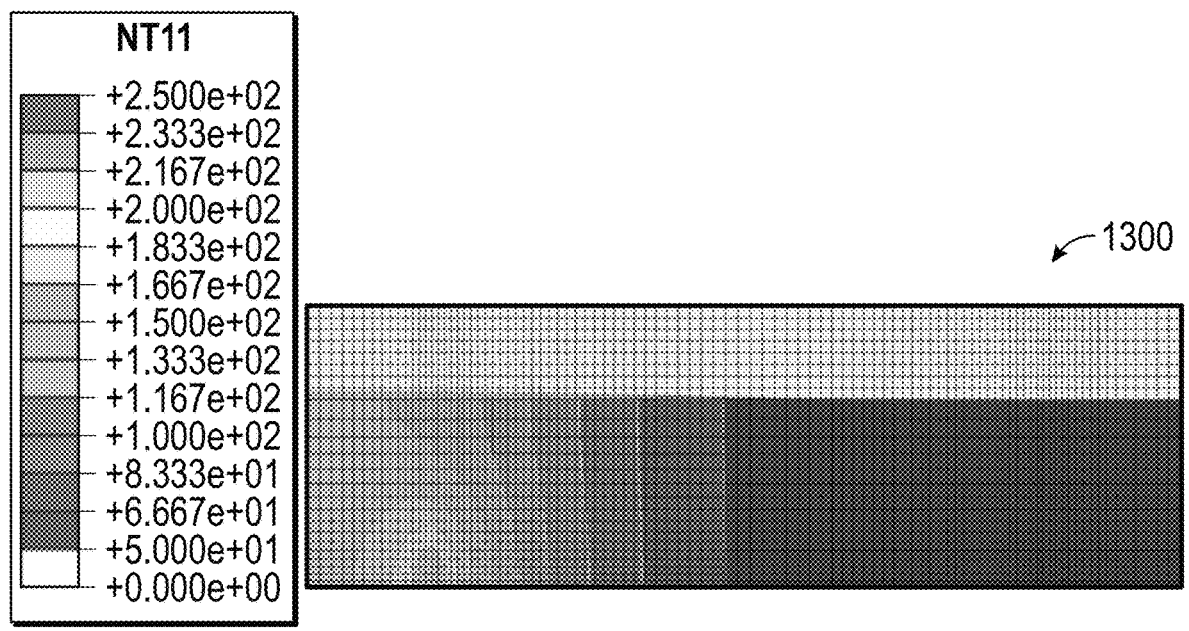
FIG. 13 is a graphical display illustrating the contour of temperature within the model during steam penetration at time t=108,000 s.
Figure 14:
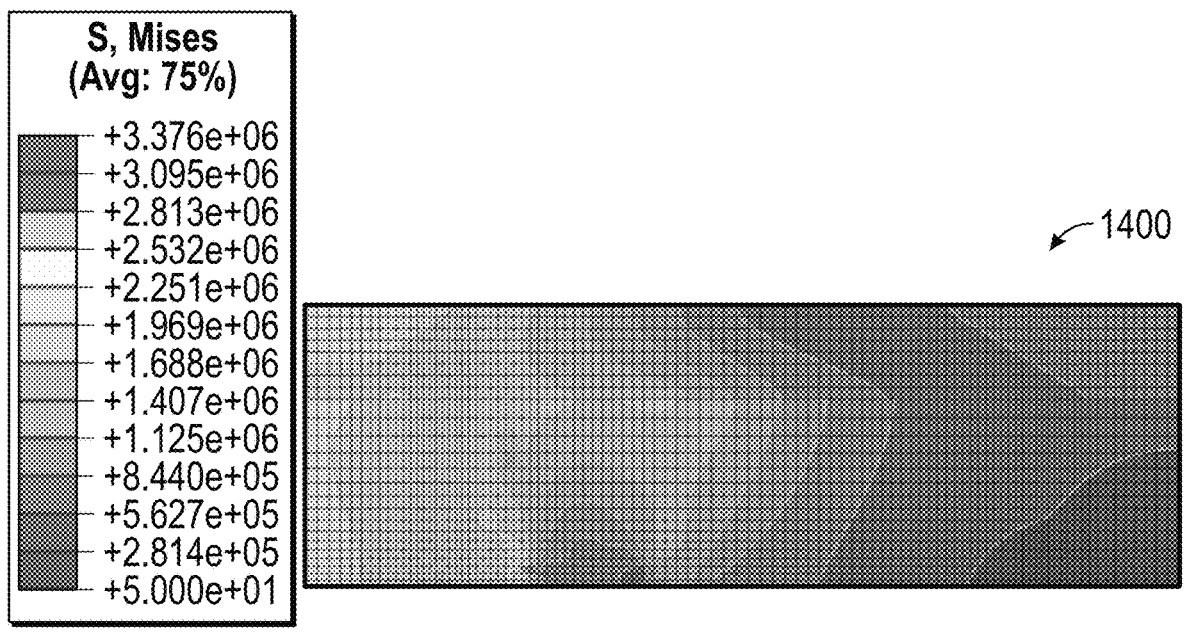
FIG. 14 is a graphical display illustrating the contour of von Mises stress within the model during steam penetration at time t=108,000 s.
Figure 15:
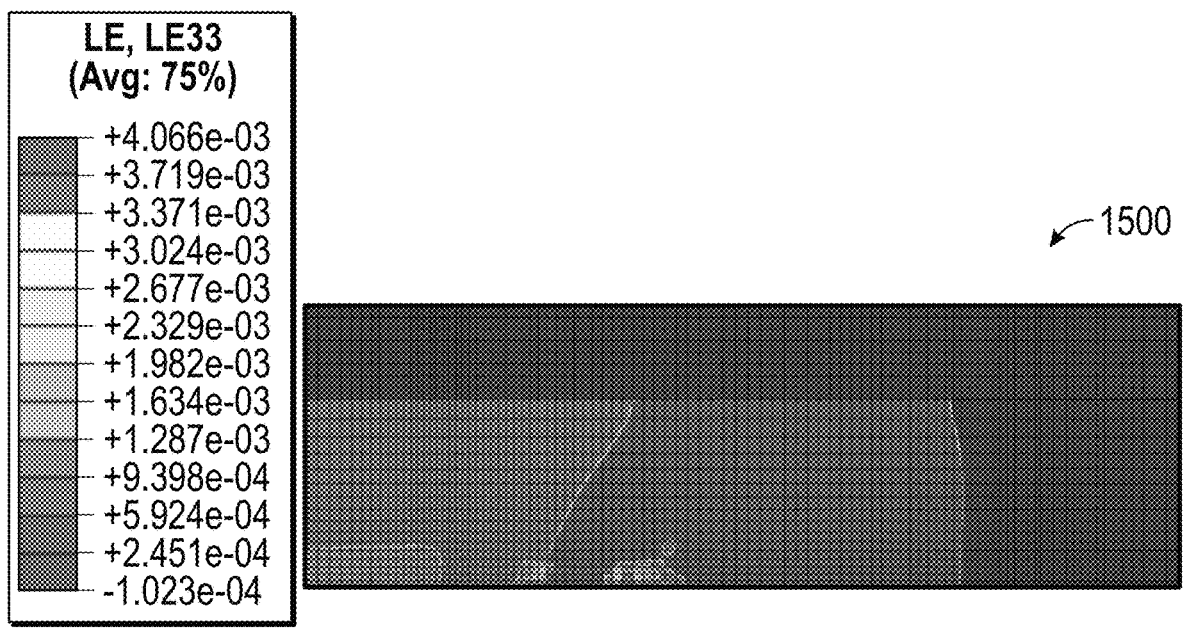
FIG. 15 is a graphical display illustrating the contour of normal strain in the vertical direction within the model during steam penetration at time t=108,000 s.
Figure 16:
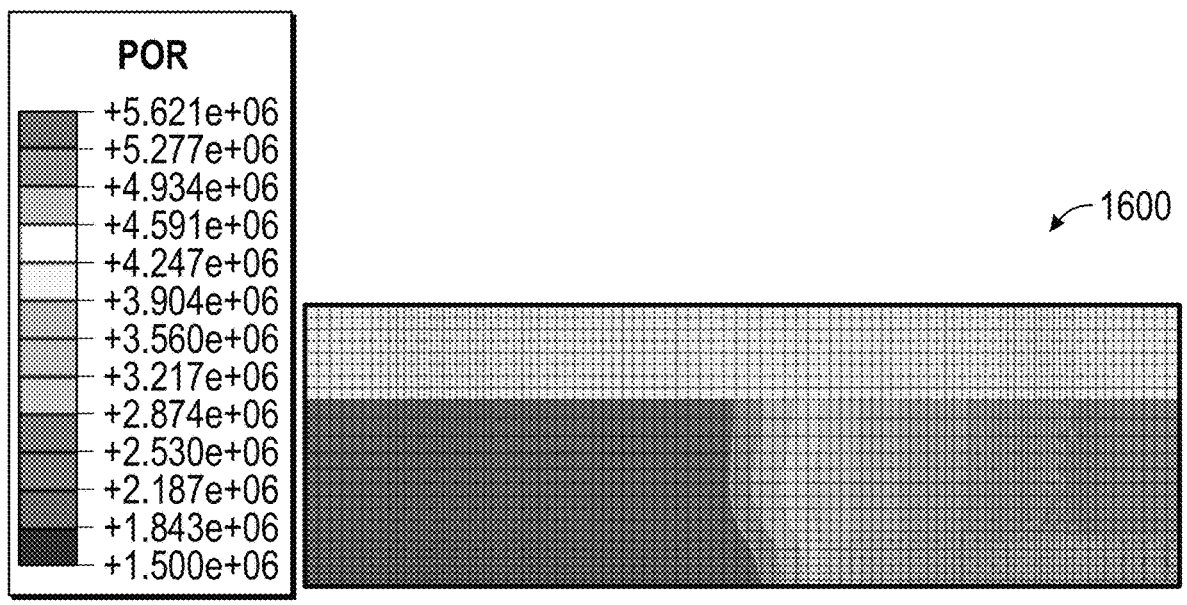
FIG. 16 is a graphical display illustrating pore pressure distribution within the model during the process of steam penetration at time t=1,000,000 s.
Figure 17:
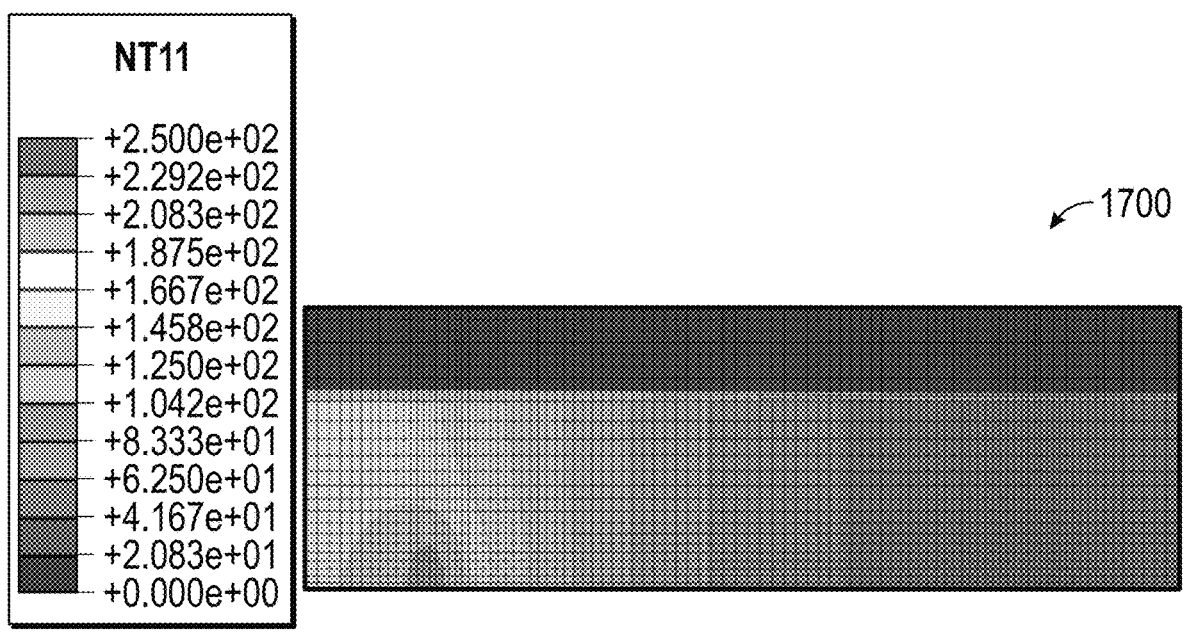
FIG. 17 is a graphical display illustrating the contour of temperature within the model during steam penetration at time t=1,000,000 s.
Figure 18:
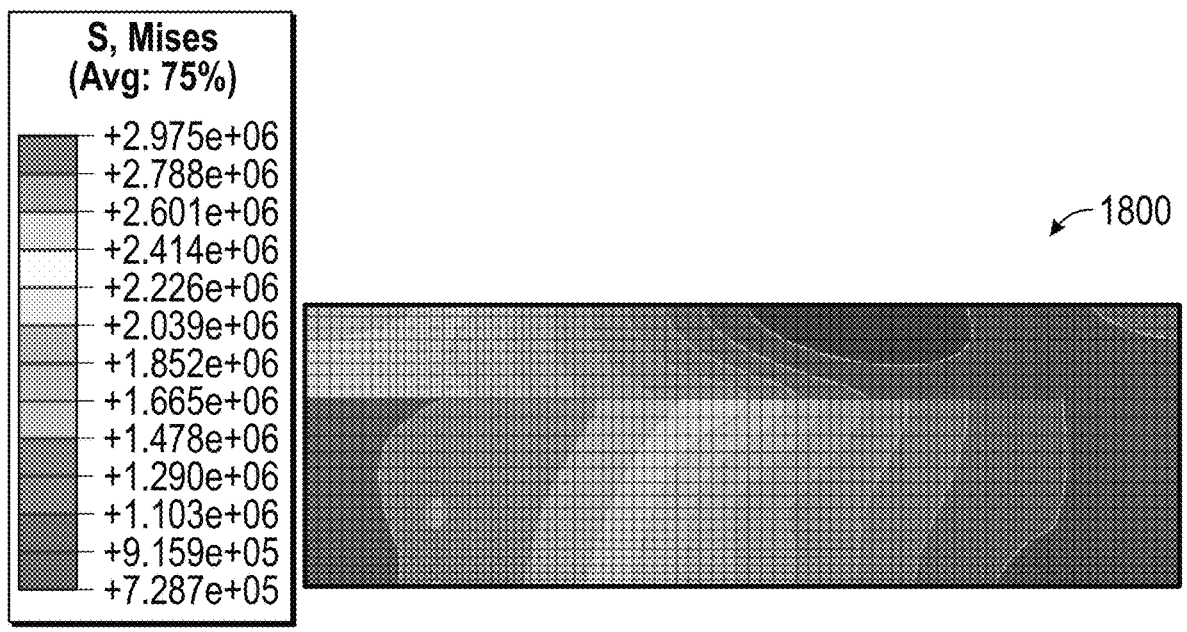
FIG. 18 is a graphical display illustrating the contour of von Mises stress within the model during steam penetration at time t=1,000,000 s.
Figure 19:
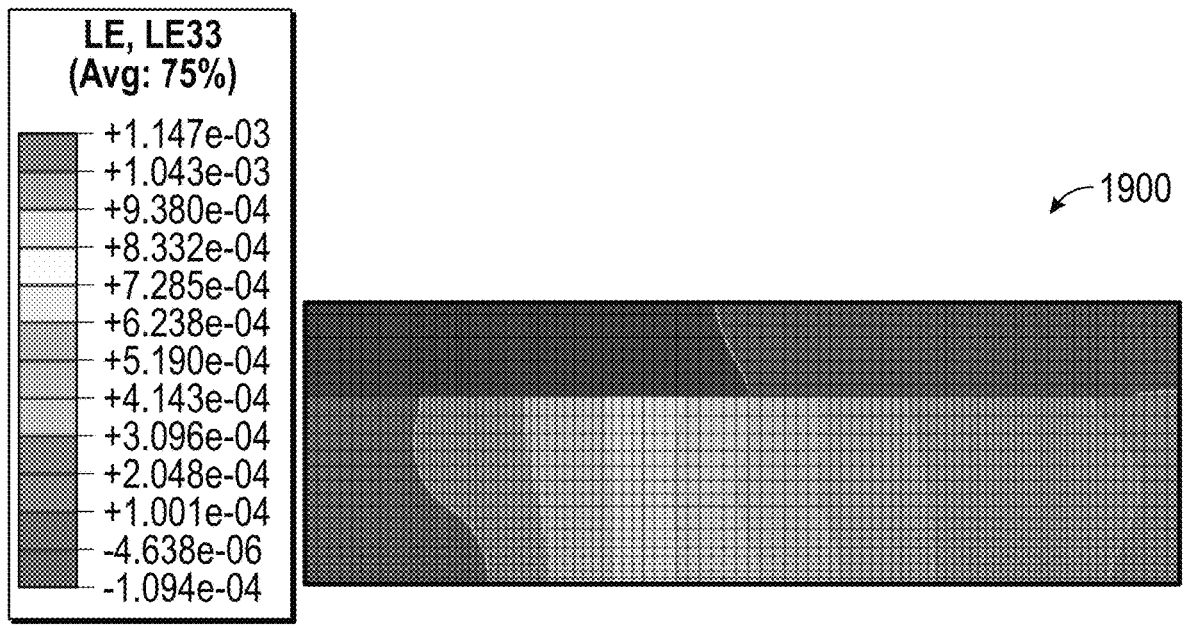
FIG. 19 is a graphical display illustrating the contour of normal strain in the vertical direction within the model during steam penetration at time t=1,000,000 s.

The symbols used in Tables 2 and 3 are given as:
k11=hydraulic conductivity in the x direction, m/s
k22=hydraulic conductivity in the y direction, m/s
k33=hydraulic conductivity in the z direction, m/c
LE11=Strain in the x direction
LE33=Strain in the z direction
E1=Elastic Modulus in the x direction, Pa
E2=Elastic Modulus in the y direction, Pa
E3=Elastic Modulus in the z direction, Pa
v12=Poisson's ratio in the x direction
v13=Poisson's ratio in the y direction
v23=Poisson's ratio in the z direction
G12=Shear Modulus in the x direction, Pa
G13=Shear Modulus in the y direction, Pa
G23=Shear Modulus in the z direction, Pa Numerical Results of Steam Penetration of Steam Flooding Referring now to FIGS. 12-19, these graphical displays illustrate various contours of temperature, von Mises stress, normal strain, and pore pressure distribution during steam penetration. In FIG. 12, the graphical display 1200 illustrates the pore pressure distribution within the model during steam penetration at time t=108,000 s, which is 1.25 days. In FIG. 13, the graphical display 1300 illustrates the contour of temperature within the model during steam penetration at time t=108,000 s. In FIG. 14, the graphical display 1400 illustrates the contour of von Mises stress within the model during steam penetration at time t=108,000 s. In FIG. 15, the graphical display 1500 illustrates the contour of normal strain in the vertical direction within the model during steam penetration at time t=108,000 s. Two lateral surfaces on the left and the right are constrained with zero normal displacement. Consequently, strain in the horizontal directions are rather impacted by these constraints. In FIG. 16, the graphical display 1600 illustrates the pore pressure distribution within the model during the process of steam penetration at time t=1,000,000 s, which is about 12 days. In FIG. 17, the graphical display 1700 illustrates the contour of temperature within the model during steam penetration at time t=1,000,000 s. In FIG. 18, the graphical display 1800 illustrates the contour of von Mises stress within the model during steam penetration at time t=1,000,000 s. In FIG. 19, the graphical display 1900 illustrates the contour of normal strain in the vertical direction within the model during steam penetration at time t=1,000,000 s.

The forgoing results for both examples demonstrate that the method 100 can properly simulate the steam fingering phenomena in the process of SAGD and steam flooding. Differences between these two examples are directed to: 1) the values of dynamic viscosity of heavy oil in steam flooding, which are lower than the comparable values of dynamic viscosity of heavy oil in SAGD and thus, the values of relevant parameters are different; and 2) the well geometry, which for SAGD is usually horizontal and for steam flooding is usually vertical.

System Description

The present disclosure may be implemented through a computer-executable program of instructions, such as program s, generally referred to as software applications or application programs executed by a computer. The software may include, for example, routines, programs, objects, components and data structures that perform particular tasks or implement particular abstract data types. The software forms an interface to allow a computer to react according to a source of input. Any FEM commercial software application may be used as an interface application to implement the present disclosure. The software may also cooperate with other code segments to initiate a variety of tasks in response to data received in conjunction with the source of the received data. The software may be stored and/or carried on any variety of memory such as CD-ROM, magnetic disk, bubble memory and semiconductor memory (e.g. various types of RAM or ROM). Furthermore, the software and its results may be transmitted over a variety of carrier media such as optical fiber, metallic wire and/or through any of a variety of networks, such as the Internet.

Moreover, those skilled in the art will appreciate that the disclosure may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Referring now to FIG. 20, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1-19. The memory therefore, includes a thermo-hydro-mechanical coupling module, which enables steps 102, 106 and 112 described in reference to FIG. 1. The thermo-hydro-mechanical coupling module may integrate functionality from the remaining application programs illustrated in FIG. 20. In particular, any FEM commercial software application may be used as an interface application to perform steps 104, 108 and 110 in FIG. 1. Although any FEM commercial software application may be used as interface application, other interface applications may be used, instead, or the thermo-hydro-mechanical coupling module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well-known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A method for performing steam injection operations in a heavy oil formation comprising:
    a) initializing material property parameters by assigning an initial value to each material property parameter;
    b) acquiring a steam injection and oil production plan, and formation data from logging tools;
    c) creating a finite element model using the formation data, the steam injection and oil production plan and one of the initial value of each initialized material property parameters and an adjusted value of each material property parameter;
    d) calculating a distribution of numerical temperatures, numerical pore pressures and displacements for the heavy oil formation;
    e) adjusting one of the initial value of each initialized material property parameter and the adjusted value of each material property parameter;
    f) repeating steps c)-e) using a computer processor until the distribution of each numerical temperature and each numerical pore pressure is within a predetermined range of each of a respective measured temperature and each of a respective measured pore pressure; and
    g) positioning one or more steam injection wells in the heavy oil formation using the last finite element model created in step c).

2. The method of claim 1, wherein the material property parameters consist of thermal conductivity, Young's Modulus, temperature dependent permeability and hydraulic conductivity.

3. The method of claim 1, wherein each respective measured temperature and each respective measured pore pressure are acquired from respective sensors distributed throughout a monitoring well.

4. The method of claim 1, further comprising calculating a final value for each material property parameter that is a function of at least one of a numerical temperature and a numerical pore pressure using the respective distribution of numerical temperatures and numerical pore pressures.

5. The method of claim 1, wherein one of the initial value of each initialized material property parameter and the adjusted value of each material property parameter is increased by a predetermined amount when the distribution of each numerical temperature and each numerical pore pressure is not within the predetermined range of each respective measured temperature and each respective measured pore pressure and when the distribution of each numerical temperature and each numerical pore pressure is smaller than each respective measured temperature and each respective measured pore pressure.

6. The method of claim 1, wherein one of the initial value of each initialized material property parameter and the adjusted value of each material property parameter is reduced by a predetermined amount when the distribution of each numerical temperature and each numerical pore pressure is not within the predetermined range of each respective measured temperature and each respective measured pore pressure and when the distribution of each numerical temperature and each numerical pore pressure is larger than each respective measured temperature and each respective measured pore pressure.

7. The method of claim 1, wherein the last finite element model created represents a fully-coupled thermo-hydro-mechanical model.

8. The method of claim 7, wherein the last finite element model is created based on i) strain-dependent conductivity; ii) thermal conductivity heat transfer based on the strain dependent conductivity and temperature dependent permeability; and iii) convective heat transfer.

9. A non-transitory program storage device tangibly carrying computer executable instructions for performing steam injection operations in a heavy oil formation, the instructions being executable to implement:
    a) initializing material property parameters by assigning an initial value to each material property parameter;
    b) acquiring a steam injection and oil production plan, and formation data from logging tools;
    c) creating a finite element model using the formation data, the steam injection and oil production plan and one of the initial value of each initialized material property parameters and an adjusted value of each material property parameter;

d) calculating a distribution of numerical temperatures, numerical pore pressures and displacements for the heavy oil formation;

e) adjusting one of the initial value of each initialized material property parameter and the adjusted value of each material property parameter;

f) repeating steps c)-e) until the distribution of each numerical temperature and each numerical pore pressure is within a predetermined range of each of a respective measured temperature and each of a respective measured pore pressure; and g) positioning one or more steam injection wells in the heavy oil formation using the last finite element model created in step c).

10. The program storage device of claim 9, wherein the material property parameters consist of thermal conductivity, Young's Modulus, temperature dependent permeability and hydraulic conductivity.

11. The program storage device of claim 9, wherein each respective measured temperature and each respective measured pore pressure are acquired from respective sensors distributed throughout a monitoring well.

12. The program storage device of claim 9, further comprising calculating a final value for each material property parameter that is a function of at least one of a numerical temperature and a numerical pore pressure using the respective distribution of numerical temperatures and numerical pore pressures.

13. The program storage device of claim 9, wherein one of the initial value of each initialized material property parameter and the adjusted value of each material property parameter is increased by a predetermined amount when the distribution of each numerical temperature and each numerical pore pressure is not within the predetermined range of each respective measured temperature and each respective measured pore pressure and when the distribution of each numerical temperature and each numerical pore pressure is smaller than each respective measured temperature and each respective measured pore pressure.

14. The program storage device of claim 9, wherein one of the initial value of each initialized material property parameter and the adjusted value of each material property parameter is reduced by a predetermined amount when the distribution of each numerical temperature and each numerical pore pressure is not within the predetermined range of each respective measured temperature and each respective measured pore pressure and when the distribution of each numerical temperature and each numerical pore pressure is larger than each respective measured temperature and each respective measured pore pressure.

15. The program storage device of claim 9, wherein the last finite element model created represents a fully-coupled thermo-hydro-mechanical model.

16. The program storage device of claim 15, wherein the last finite element model is created based on i) strain-dependent conductivity; ii) thermal conductivity heat transfer based on the strain dependent conductivity and temperature dependent permeability; and iii) convective heat transfer.

17. A non-transitory program storage device tangibly carrying computer executable instructions for performing steam injection operations in a heavy oil formation, the instructions being executable to implement:

a) initializing material property parameters by assigning an initial value to each material property parameter, wherein the material property parameters consist of thermal conductivity, Young's Modulus, temperature dependent permeability and hydraulic conductivity;

b) acquiring a steam injection and oil production plan, and formation data from logging tools;

c) creating a finite element model using the formation data, the steam injection and oil production plan and one of the initial value of each initialized material property parameters and an adjusted value of each material property parameter;

d) calculating a distribution of numerical temperatures, numerical pore pressures and displacements for the heavy oil formation;

e) adjusting one of the initial value of each initialized material property parameter and the adjusted value of each material property parameter; and f) repeating steps c)-e) until the distribution of each numerical temperature and each numerical pore pressure is within a predetermined range of each of a respective measured temperature and each of a respective measured pore pressure.

18. The program storage device of claim 17, wherein each respective measured temperature and each respective measured pore pressure are acquired from respective sensors distributed throughout a monitoring well.

19. The program storage device of claim 17, further comprising calculating a final value for each material property parameter that is a function of at least one of a numerical temperature and a numerical pore pressure using the respective distribution of numerical temperatures and numerical pore pressures.

20. The program storage device of claim 17, wherein the last finite element model created represents a fully-coupled thermo-hydro-mechanical model.

* * * * *